(12) United States Patent
Xi

(10) Patent No.: US 11,158,274 B1
(45) Date of Patent: Oct. 26, 2021

(54) GOA CIRCUIT AND LIQUID CRYSTAL DISPLAY PANEL

(71) Applicant: Shenzhen China Star Optoelectronics Semiconductor Display Technology Co., Ltd., Shenzhen (CN)

(72) Inventor: Suping Xi, Shenzhen (CN)

(73) Assignee: SHENZHEN CHINA STAR OPTOELECTRONICS SEMICONDUCTOR DISPLAY TECHNOLOGY CO. LTD., Shenzhen (CN)

( * ) Notice: Subject to any disclaimer, the term of this patent is extended or adjusted under 35 U.S.C. 154(b) by 202 days.

(21) Appl. No.: 16/625,259

(22) PCT Filed: Dec. 13, 2019

(86) PCT No.: PCT/CN2019/124989
§ 371 (c)(1),
(2) Date: Dec. 20, 2019

(87) PCT Pub. No.: WO2021/103164
PCT Pub. Date: Jun. 3, 2021

(30) Foreign Application Priority Data

Nov. 26, 2019 (CN) .......................... 201911174730.2

(51) Int. Cl.
*G09G 5/00* (2006.01)
*G09G 3/36* (2006.01)

(52) U.S. Cl.
CPC ......... *G09G 3/3674* (2013.01); *G09G 3/3696* (2013.01); *G09G 2300/0408* (2013.01); *G09G 2310/08* (2013.01); *G09G 2320/0204* (2013.01)

(58) Field of Classification Search
CPC ...... G09G 3/36; G09G 3/3674; G09G 3/3677; G09G 3/3696; G09G 2300/0408;
(Continued)

(56) References Cited

U.S. PATENT DOCUMENTS 10,475,407 B2 * 11/2019 Zeng ..................... H01L 27/124
10,613,661 B2 * 4/2020 Huang .................. G06F 3/0412
(Continued)

FOREIGN PATENT DOCUMENTS

CN 107146589 A 9/2017
CN 108766380 A 11/2018
(Continued)

*Primary Examiner* — Joe H Cheng
(74) *Attorney, Agent, or Firm* — Luedeka Neely Group, P.C.

(57) ABSTRACT

The present disclosure provides a gate driver on array (GOA) circuit and a liquid crystal display panel. A blocking unit is disposed in each stages of GOA units. When a first node is at a high voltage potential and a stage signal is also at a high voltage potential, a first control signal and a second control signal are at a low voltage potential and both gates of a twelfth thin-film transistor (TFT) and a thirteenth TFT are at the low voltage potential so that gate-source voltage differences between the twelfth TFT and the thirteenth TFT are large enough to properly turn off the twelfth TFT and the thirteenth TFT. Thus, current leakage of the first node is prevented.

20 Claims, 3 Drawing Sheets

(58) Field of Classification Search
CPC ....... G09G 2310/0286; G09G 2310/08; G09G 2320/0204
See application file for complete search history.

(56) References Cited

U.S. PATENT DOCUMENTS

| | | | |
|---|---|---|---|
| 10,896,654 B2* | 1/2021 | Li | G09G 3/3677 |
| 10,984,696 B1* | 4/2021 | Xi | H03K 19/01735 |
| 10,997,886 B2* | 5/2021 | Huang | G09G 3/20 |
| 11,004,380 B2* | 5/2021 | Dai | G09G 3/2092 |
| 2016/0358666 A1* | 12/2016 | Pang | G09G 3/3688 |
| 2017/0102805 A1* | 4/2017 | Xiao | G06F 3/044 |
| 2017/0278450 A1* | 9/2017 | Ma | G09G 3/3648 |
| 2018/0090087 A1* | 3/2018 | Shi | G09G 3/3648 |
| 2018/0218698 A1* | 8/2018 | Li | G09G 3/3674 |
| 2019/0130858 A1* | 5/2019 | Xiao | G09G 3/3677 |
| 2019/0130859 A1* | 5/2019 | Dai | G11C 19/28 |
| 2020/0043436 A1 | 2/2020 | Li | |
| 2021/0082334 A1* | 3/2021 | Dai | G09G 3/2092 |

FOREIGN PATENT DOCUMENTS

| | | | |
|---|---|---|---|
| CN | 109345998 A | | 2/2019 |
| CN | 110097861 A | * | 8/2019 |
| CN | 110097861 A | | 8/2019 |
| KR | 20170141036 A | | 12/2017 |

* cited by examiner

GOA CIRCUIT AND LIQUID CRYSTAL DISPLAY PANEL

CROSS REFERENCE TO RELATED APPLICATIONS

This application is the National Stage of PCT/CN2019/124989 filed on Dec. 13, 2019, which claims priority under 35 U.S.C. § 119 of Chinese Application No. 201911174730.2 filed on Nov. 26, 2019, and the title is "GOA circuit and liquid crystal display panel". The content of the application is cited and incorporated in the present disclosure.

FIELD OF INVENTION

The present disclosure relates to the field of display technologies, and more particularly, to a gate driver on array (GOA) circuit and a liquid crystal display panel.

BACKGROUND OF INVENTION

GOA technology utilizes existing liquid crystal display (LCD) panel arrays to form scan driving signal circuits of gate lines on array substrates to achieve the driving method of scanning gates row by row.

GOA technology has advantages such as saving a number of gate driver integrated circuit (IC) and achieving a narrower bezel, etc., and has been widely applied in panel design. Therefore, it is necessary to further stabilize GOA performance. In order to improve stability of GOA, a sufficient margin of a first node (node Q) of a GOA circuit is required. Especially, when the GOA circuit operates at high temperature, current leakage of thin film transistors (TFTs) in the GOA circuit increases, and thus the node cannot effectively maintain a required voltage potential, which affects the margin of the GOA circuit and further affects the performance of the GOA circuit.

Therefore, the problem of current leakage at node Q in the existing GOA circuit needs to be solved.

SUMMARY OF INVENTION

The present disclosure provides a gate driver on array (GOA) circuit and a liquid crystal display panel to solve problems of current leakage at node Q in existing GOA circuit.

To solve the problems above, the present disclosure provides the following technical solutions.

The present disclosure provides a GOA circuit comprising a plurality of cascaded GOA units, wherein each stage of the GOA units comprises a pull-up control module, a pull-up module, a pull-down module, a pull-down holding module, and a hand-down module, wherein n is an integer, and wherein in an nth stage of the GOA unit: the pull-up control module is electrically connected to a first node and is configured to receive a first start signal for pulling up a voltage potential of the first node under a control of the first start signal. The pull-up module is electrically connected to a first node and is configured to receive a high frequency clock signal for outputting a scan signal according to the high frequency clock signal under a control of the first node. The pull-down module is electrically connected to the first node and is configured to receive a second start signal and a constant low voltage for pulling down voltage potentials of the first node and the scan signal to the constant low voltage under a control of the second start signal. The pull-down holding module is electrically connected to the first node and the constant low voltage and is configured to receive a first low frequency clock signal and a second low frequency clock signal for holding the voltage potentials of the first node at the constant low voltage and alternately outputting a first control signal and a second control signal under alternate affections of the first low frequency clock signal and the second low frequency clock signal. The hand-down module is electrically connected to a first node and is configured to receive the high frequency clock signal for outputting a stage signal according to the high frequency clock signal under the control of the first node. The pull-down holding module further comprises a blocking unit, and the blocking unit is electrically connected to the constant low voltage and the stage signal and is configured to receive the first control signal and the second control signal for blocking a leaking current of the first node.

In the GOA circuit of the present disclosure, the hand-down module comprises a first thin film transistor, TFT, a gate of the first TFT is connected to the first node, a source of the first TFT is connected to the high frequency clock signal, and a drain of the first TFT is configured to output the stage signal.

In the GOA circuit of the present disclosure, the pull-down holding module comprises a first pull-down holding unit and a second pull-down holding unit 402. The first pull-down holding unit is electrically connected to the first node, a second node, and the constant low voltage and configured to receive the first low frequency clock signal for pulling down voltage potentials of the second node and the first control signal K(n) to the constant low voltage when the voltage potential of the first node is pulled up, and holding the voltage potential of the first node at the constant low voltage by periodically raising the voltage potential of the second node according to the first low frequency clock signal after the voltage potential of the first node being pulled down; and wherein the first pull-down holding unit simultaneously outputs the first control signal. The second pull-down holding unit is electrically connected to the first node, a third node, and the constant low voltage and is configured to receive the second low frequency clock signal for pulling down voltage potentials of the third node and the second control signal to the constant low voltage when the voltage potential of the first node is pulled up, and holding the voltage potential of the first node at the constant low voltage by periodically raising the voltage potential of the third node according to the second low frequency clock signal after the voltage potential of the first node being pulled down; and wherein the second pull-down holding unit simultaneously outputs the second control signal.

In the GOA circuit of the present disclosure, the first pull-down holding unit comprises a second TFT, a third TFT, a fourth TFT, and a fifth TFT. A gate of the second TFT and a source of the second TFT are both connected to the first low frequency clock signal, and a drain of the second TFT is connected to the second node. A gate of the third TFT is connected to the first node, a source of the third TFT is connected to the second node, and a drain of the third TFT is connected to the constant low voltage. A gate of the fourth TFT is connected to the second node, a source of the fourth TFT is connected to the first low frequency clock signal, and a drain of the fourth TFT is configured to output the first control signal K(n). A gate of the fifth TFT is connected to the first node, a source of the fifth TFT is connected to the constant low voltage, and a drain of the fifth TFT is configured to output the first control signal.

In the GOA circuit of the present disclosure, the second pull-down holding unit comprises a sixth TFT, a seventh TFT, an eighth TFT, and a ninth TFT. A gate of the sixth TFT and a source of the sixth TFT are both connected to the second low frequency clock signal, and a drain of the sixth TFT is connected to the third node. A gate of the seventh TFT is connected to the first node, a source of the seventh TFT is connected to the third node, and a drain of the seventh TFT is connected to the constant low voltage. A gate of the eighth TFT is connected to the third node, a source of the eighth TFT is connected to the second low frequency clock signal, and a drain of the eighth TFT is configured to output the second control signal. A gate of the ninth TFT is connected to the first node, a source of the ninth TFT is connected to the constant low voltage, and a drain of the ninth TFT is configured to output the second control signal.

In the GOA circuit of the present disclosure, the pull-down holding module further comprises a tenth TFT and an eleventh TFT. A gate of the tenth TFT is connected to the first control signal, a source of the tenth TFT is connected to the first node, and a drain of the tenth TFT is configured to receive the stage signal. A gate of the eleventh TFT is connected to the second control signal, a source of the eleventh TFT is connected to the first node, and a drain of the eleventh TFT is configured to receive the stage signal.

In the GOA circuit of the present disclosure, the blocking unit comprises a twelfth TFT and a thirteenth TFT. A gate of the twelfth TFT is connected to the first control signal, a source of the twelfth TFT is connected to the stage signal, and a drain of the twelfth TFT is connected to the constant low voltage. A gate of the thirteenth TFT is connected to the second control signal, a source of the thirteenth TFT is connected to the stage signal, and a drain of the thirteenth TFT is connected to the constant low voltage.

In the GOA circuit of the present disclosure, each stage of the GOA units further comprises a bootstrap module 700 electrically connected to the first node and the scan signal and configured to raise and hold the voltage potential of the raised first node when the scan signal outputs a high voltage potential.

In the GOA circuit of the present disclosure, the bootstrap module 700 comprises a capacitor, a first electrode plate of the capacitor is electrically connected to the first node, and a second electrode plate of the capacitor is electrically connected to the scan signal.

In the GOA circuit of the present disclosure, the pull-up control module further comprises a third start signal, in first to fourth stages of the GOA units, the first start signals and the third start signals are equal to a starting signal, in the nth stage of the GOA units except the first to the fourth stages of the GOA units, the first start signal is equal to a scan signal of a (n−4)th stage of the GOA units and the third start signal is equal to a stage signal of the (n−4)th stage of the GOA units, in a last stage to a fourth-to-last stage of the GOA units, the second start signals are equal to the starting signal, and in the nth stage of the GOA units except the last stage to the fourth-to-last stage of the GOA units, the second start signal is equal to a scan signal of a (n+4)th stage of the GOA unit.

The present disclosure further provides a liquid crystal display (LCD) panel comprising a gate driver on array, GOA, circuit, wherein the GOA circuit comprises a plurality of cascaded GOA units. Each stage of the GOA units includes a pull-up control module, a pull-up module, a pull-down module, a pull-down holding module, and a hand-down module. Where n is an integer, and in an nth stage of the GOA unit: The pull-up control module is electrically connected to a first node and is configured to receive a first start signal for pulling up a voltage potential of the first node under a control of the first start signal. The pull-up module is electrically connected to a first node and is configured to receive a high frequency clock signal for outputting a scan signal according to the high frequency clock signal under a control of the first node.

The pull-down module is electrically connected to the first node and is configured to receive a second start signal and a constant low voltage for pulling down voltage potentials of the first node and the scan signal to the constant low voltage under a control of the second start signal. The pull-down holding module is electrically connected to the first node and the constant low voltage and is configured to receive a first low frequency clock signal and a second low frequency clock signal for holding the voltage potentials of the first node at the constant low voltage and alternately outputting a first control signal and a second control signal under alternate affections of the first low frequency clock signal and the second low frequency clock signal. The hand-down module is electrically connected to a first node and is configured to receive the high frequency clock signal for outputting a stage signal according to the high frequency clock signal under the control of the first node. The pull-down holding module further includes a blocking unit, and the blocking unit is electrically connected to the constant low voltage and the stage signal and is configured to receive the first control signal and the second control signal for blocking a leaking current of the first node.

In the LCD panel of the present disclosure, the hand-down module includes a first, thin film transistor, TFT, a gate of the first TFT is connected to the first node, a source of the first TFT is connected to the high frequency clock signal, and a drain of the first TFT is configured to output the stage signal.

In the LCD panel of the present disclosure, the pull-down holding module comprises a first pull-down holding unit and a second pull-down holding unit (402). The first pull-down holding unit is electrically connected to the first node Q(n), a second node, and the constant low voltage and is configured to receive the first low frequency clock signal for pulling down voltage potentials of the second node and the first control signal to the constant low voltage when the voltage potential of the first node is pulled up, and holding the voltage potential of the first node at the constant low voltage by periodically raising the voltage potential of the second node according to the first low frequency clock signal after the voltage potential of the first node being pulled down; and wherein the first pull-down holding unit simultaneously outputs the first control signal. The second pull-down holding unit is electrically connected to the first node, a third node, and the constant low voltage and is configured to receive the second low frequency clock signal for pulling down voltage potentials of the third node and the second control signal to the constant low voltage when the voltage potential of the first node is pulled up, and holding the voltage potential of the first node at the constant low voltage by periodically raising the voltage potential of the third node according to the second low frequency clock signal after the voltage potential of the first node being pulled down; and wherein the second pull-down holding unit (402) simultaneously outputs the second control signal.

In the LCD panel of the present disclosure, the first pull-down holding unit comprises a second TFT, a third TFT, a fourth TFT, and a fifth TFT. A gate of the second TFT and a source of the second TFT are both connected to the first low frequency clock signal. A drain of the second TFT is connected to the second node. Agate of the third TFT is connected to the first node Q(n), a source of the third TFT is connected to the second node, and a drain of the third TFT is connected to the constant low voltage. A gate of the fourth TFT is connected to the second node, a source of the fourth TFT is connected to the first low frequency clock signal, and a drain of the fourth TFT is connected to the first control signal. A gate of the fifth TFT is connected to the first node Q(n), a source of the fifth TFT is connected to the constant low voltage, and a drain of the fifth TFT is configured to output the first control signal.

In the LCD panel of the present disclosure, the second pull-down holding unit comprises a sixth TFT, a seventh TFT, an eighth TFT, and a ninth TFT. A gate of the sixth TFT and a source of the sixth TFT are both connected to the second low frequency clock signal, and a drain of the sixth TFT is connected to the third node. A gate of the seventh TFT is connected to the first node Q(n), a source of the seventh TFT is connected to the third node, and a drain of the seventh TFT is connected to the constant low voltage. A gate of the eighth TFT is connected to the third node, a source of the eighth TFT is connected to the second low frequency clock signal, and a drain of the eighth TFT is configured to output the second control signal. A gate of the ninth TFT is connected to the first node Q(n), a source of the ninth TFT is connected to the constant low voltage, and a drain of the ninth TFT is configured to output the second control signal.

In the LCD panel of the present disclosure, the pull-down holding module further comprises a tenth TFT and an eleventh TFT. A gate of the tenth TFT is connected to the first control signal, a source of the tenth TFT is connected to the first node, and a drain of the tenth TFT is configured to receive the stage signal. A gate of the eleventh TFT is connected to the second control signal, a source of the eleventh TFT is connected to the first node, and a drain of the eleventh TFT is configured to receive the stage signal.

In the LCD panel of the present disclosure, the blocking unit comprises a twelfth TFT and a thirteenth TFT. A gate of the twelfth TFT is connected to the first control signal, a source of the twelfth TFT is connected to the stage signal, and a drain of the twelfth TFT is connected to the constant low voltage. A gate of the thirteenth TFT is connected to the second control signal, a source of the thirteenth TFT is connected to the stage signal, and a drain of the thirteenth TFT is connected to the constant low voltage.

In the LCD panel of the present disclosure, each stage of the GOA units further comprises a bootstrap module electrically connected to the first node and the scan signal and configured to raise and hold the raised voltage potential of the first node when the scan signal outputs a high voltage potential.

In the LCD panel of the present disclosure, the bootstrap module comprises a capacitor, a first electrode plate of the capacitor is electrically connected to the first node and a second electrode plate of the capacitor is electrically connected to the scan signal.

In the LCD panel of the present disclosure, the pull-up control module further comprises a third start signal, in first to fourth stages of the GOA units, the first start signals and the third start signals are equal to a starting signal, in the nth stage of the GOA units except the first to the fourth stages of the GOA units, the first start signal is equal to a scan signal of a (n−4)th stage of the GOA units and the third start signal is equal to a stage signal of the (n−4)th stage of the GOA units, in a last stage to a fourth-to-last stage of the GOA units, the second start signals are equal to the starting signal, and in the nth stage of the GOA units except the last stage to the fourth-to-last stage of the GOA units, the second start signal is equal to a scan signal of a (n+4)th stage of the GOA unit The beneficial effect is: in the GOA circuit and the liquid crystal display panel provided by the present disclosure, the blocking unit is disposed in each stage of the GOA units for blocking the leaking currents of the first node. The blocking unit includes the twelfth TFT and the thirteenth TFT. When the first node is at the high voltage potential and the stage signal is also at the high voltage potential, the first control signal and the second control signal are at the low voltage potential, and both gates of the twelfth TFT and the thirteenth TFT are at the low voltage potential, so that the gate-source voltage differences between the twelfth TFT and the thirteenth TFT are large enough to properly turn off the twelfth TFT and the thirteenth TFT. Thus, leakage of currents of the first node is prevented, allowing the GOA circuit to have higher temperature tolerance so that its reliability is enhanced.

DESCRIPTION OF DRAWINGS

In order to clarify the technical solutions of embodiments of the present disclosure, drawings required to describe the embodiments are briefly illustrated.

Obviously, the mentioned embodiments are only parts of the embodiments instead of all of the embodiments. Other embodiments can be obtained by a skilled person in the art without creative effort fall in the protected scope of the present disclosure.

DETAILED DESCRIPTION OF PREFERRED EMBODIMENTS

Figure 1:
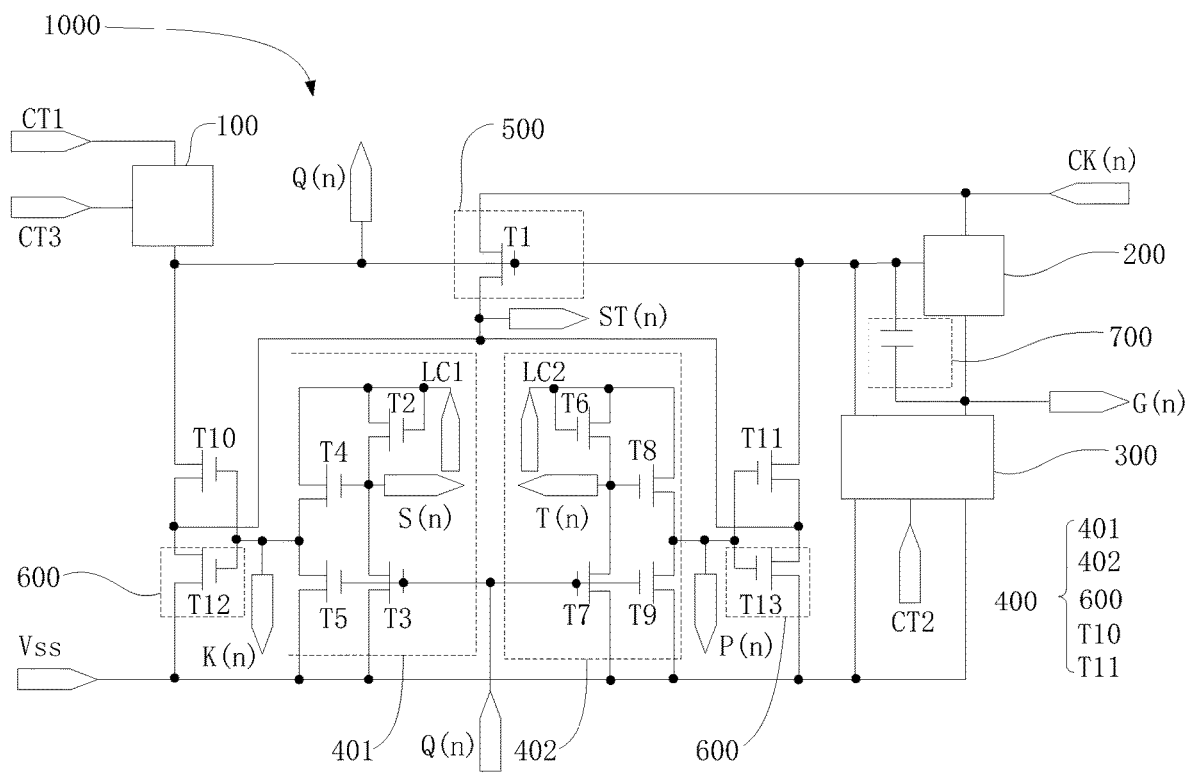
FIG. 1 illustrates a structural diagram of a gate driver on array (GOA) circuit of an embodiment of the present disclosure.

The embodiments of the present disclosure are described in detail below, and the examples of the embodiments are illustrated in the drawings. The same or similar reference numbers are used to refer to the same or similar elements or elements having the same or similar functions. The embodiments described below accompanying with the drawings are illustrative and are only used to explain the present disclosure rather than limiting the present disclosure.

One of the embodiments, as shown in FIG. 1, provides a gate driver on array (GOA) circuit including a plurality of cascaded GOA units 1000. Each stage of the GOA units 1000 includes a pull-up control module 100, a pull-up module 200, a pull-down module 300, a pull-down holding module 400, and a hand-down module 500. Wherein, n is an integer, and in an nth stage of the GOA unit 1000: the pull-up control module 100 is electrically connected to a first node Q(n) and is configured to receive a first start signal CT1 for pulling up a voltage potential of the first node Q(n) under a control of the first start signal CT1. The pull-up module 200 is electrically connected to the first node Q(n) and is configured to receive a high frequency clock signal CK(n) for outputting a scan signal G(n) according to the high frequency clock signal CK(n) under a control of the first node Q(n). The pull-down module 300 is electrically connected to the first node Q(n) and is configured to receive a second start signal CT2 and a constant low voltage Vss for pulling down voltage potentials of the first node Q(n) and the scan signal G(n) to the constant low voltage Vss under a control of the second start signal CT2. The pull-down holding module 400 is electrically connected to the first node Q(n) and the constant low voltage Vss and is configured to receive a first low frequency clock signal LC1 and a second low frequency clock signal LC2 for holding the voltage potentials of the first node Q(n) at the constant low voltage Vss and alternately outputting a first control signal K(n) and a second control signal P(n) under alternating actions of the first low frequency clock signal LC1 and the second low frequency clock signal LC2. The hand-down module 500 is electrically connected to the first node Q(n) and is configured to receive the high frequency clock signal CK(n) for outputting a stage signal ST(n) according to the high frequency clock signal CK(n) under the control of the first node Q(n). The pull-down holding module 400 further includes a blocking unit 600. The blocking unit 600 is electrically connected to the constant low voltage Vss and the stage signal ST(n) and is configured to receive the first control signal K(n) and the second control signal P(n) for blocking a leaking current of the first node Q(n).

In one of the embodiments, each stage of the GOA units 1000 further includes a bootstrap module 700 electrically connected to the first node Q(n) and the scan signal G(n). The bootstrap module is configured to raise and hold the raised voltage potential of the first node Q(n) when the scan signal G(n) outputs a high voltage potential.

Furthermore, the bootstrap module 700 includes a capacitor, wherein a first electrode plate of the capacitor is electrically connected to the first node Q(n), and a second electrode plate of the capacitor is electrically connected to the scan signal G(n).

In one of the embodiments, the pull-up control module 100 further includes a third start signal CT3. In the first to the fourth stages of the GOA units, the first start signals CT1 and the third start signals CT3 are equal to a starting signal STV. In the nth stage of the GOA units except the first to the fourth stages of the GOA units, the first start signal CT1 is equal to a scan signal G(n−4) of an n−4th stage of the GOA units, and the third start signal CT3 is equal to a stage signal ST(n−4) of the n−4th stage of the GOA units. In a last stage to a fourth-to-last stage of the GOA units, the second start signals CT2 are equal to the starting signal STV. In the nth stage of the GOA units except the last stage to the fourth-to-last stage of the GOA units, the second start signal CT2 is equal to a scan signal G(n+4) of an n+4th stage of the GOA unit.

More particularly, as shown in FIG. 1, the hand-down module 500 includes a first thin film transistor (TFT) T1. A gate of the first TFT T1 is connected to the first node Q(n). A source of the first TFT T1 is connected to the high frequency clock signal CK(n). A drain of the first TFT T1 is configured to output the stage signal ST(n).

More particularly, the pull-down holding module 400 includes a first pull-down holding unit 401 and a second pull-down holding unit 402. The first pull-down holding unit 401 is electrically connected to the first node Q(n), a second node S(n), and the constant low voltage Vss. The first pull-down holding unit 401 is configured to receive the first low frequency clock signal LC1 for pulling down voltage potentials of the second node S(n) and the first control signal K(n) to the constant low voltage Vss when the voltage potential of the first node Q(n) is pulled up, and holding the voltage potential of the first node Q(n) at the constant low voltage Vss by periodically raising the voltage potential of the second node S(n) according to the first low frequency clock signal LC1 after the voltage potential of the first node Q(n) is pulled down. The first pull-down holding unit 401 simultaneously outputs the first control signal K(n). The second pull-down holding unit 402 is electrically connected to the first node Q(n), a third node T(n), and the constant low voltage Vss. The second pull-down holding unit 402 is configured to receive the second low frequency clock signal LC2 for pulling down voltage potentials of the third node T(n) and the second control signal P(n) to the constant low voltage Vss when the voltage potential of the first node Q(n) is pulled up, and holding the voltage potential of the first node Q(n) at the constant low voltage Vss by periodically raising the voltage potential of the third node T(n) according to the second low frequency clock signal LC2 after the voltage potential of the first node Q(n) is pulled down. The second pull-down holding unit 402 simultaneously outputs the second control signal P(n).

Furthermore, the first pull-down holding unit 401 includes a second TFT T2, a third TFT T3, a fourth TFT T4, and a fifth TFT T5. A gate of the second TFT T2 and a source of the second TFT T2 are both connected to the first low frequency clock signal LC1. A drain of the second TFT T2 is connected to the second node S(n). A gate of the third TFT T3 is connected to the first node Q(n). A source of the third TFT T3 is connected to the second node S(n). A drain of the third TFT T3 is connected to the constant low voltage Vss. A gate of the fourth TFT T4 is connected to the second node S(n). A source of the fourth TFT T4 is connected to the first low frequency clock signal LC1. A drain of the fourth TFT T4 is configured to output the first control signal K(n). A gate of the fifth TFT T5 is connected to the first node Q(n). A source of the fifth TFT T5 is connected to the constant low voltage Vss. A drain of the fifth TFT T5 is configured to output the first control signal K(n).

Furthermore, the second pull-down holding unit 402 includes a sixth TFT T6, a seventh TFT T7, an eighth TFT T8, and a ninth TFT T9. A gate of the sixth TFT T6 and a source of the sixth TFT T6 are both connected to the second low frequency clock signal LC2. A drain of the sixth TFT T6 is connected to the third node T(n). A gate of the seventh TFT T7 is connected to the first node Q(n). A source of the seventh TFT T7 is connected to the third node T(n). A drain of the seventh TFT T7 is connected to the constant low voltage Vss. A gate of the eighth TFT T8 is connected to the third node T(n). A source of the eighth TFT T8 is connected to the second low frequency clock signal LC2. A drain of the eighth TFT T8 is configured to output the second control signal P(n). A gate of the ninth TFT T9 is connected to the first node Q(n). A source of the ninth TFT T9 is connected to the constant low voltage Vss. A drain of the ninth TFT T9 is configured to output the second control signal P(n).

More particularly, the pull-down holding module 400 further includes a tenth TFT T10 and an eleventh TFT T11. A gate of the tenth TFT T10 is connected to the first control signal K(n). A source of the tenth TFT T10 is connected to the first node Q(n). A drain of the tenth TFT T10 is configured to receive the stage signal ST(n). A gate of the eleventh TFT T11 is connected to the second control signal P(n). A source of the eleventh TFT T11 is connected to the first node Q(n). A drain of the eleventh TFT T11 is configured to receive the stage signal ST(n).

More particularly, the blocking unit 600 includes a twelfth TFT T12 and a thirteenth TFT T13. A gate of the twelfth TFT T12 is connected to the first control signal K(n). A source of the twelfth TFT T12 is connected to the stage signal ST(n). A drain of the twelfth TFT T12 is connected to the constant low voltage Vss. A gate of the thirteenth TFT T13 is connected to the second control signal P(n). A source of the thirteenth TFT T13 is connected to the stage signal ST(n). A drain of the thirteenth TFT T1 is connected to the constant low voltage Vss.

Figure 2:
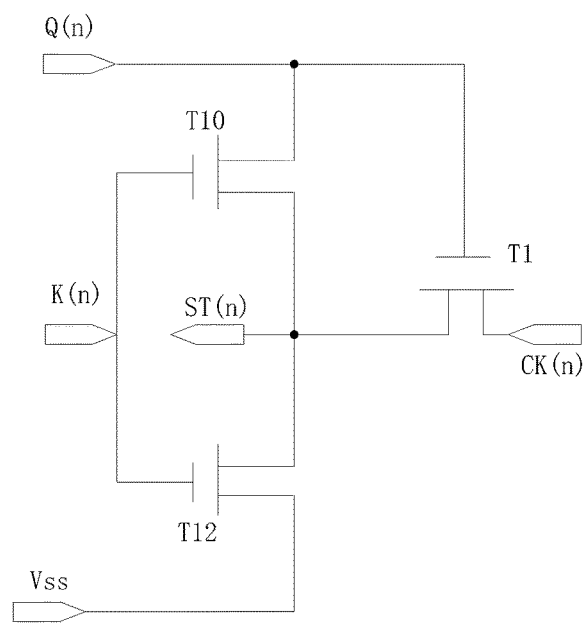
FIG. 2 illustrates a structural diagram of a first STT circuit of an embodiment of the present disclosure.

More particularly, the first TFT T1, the twelfth TFT T12, and the tenth TFT T10 form a series of thin-film transistor (STT) structure, as shown in FIG. 2, when the first low frequency clock signal LC1 operates. The first TFT T1, the thirteenth TFT T13, and the eleventh TFT T11 form the STT structure, as shown in FIG. 3, when the second low frequency clock signal LC2 operates.

It should be noted that the STT structure refer to a structure consisting of a series of TFTs.

Figure 4:
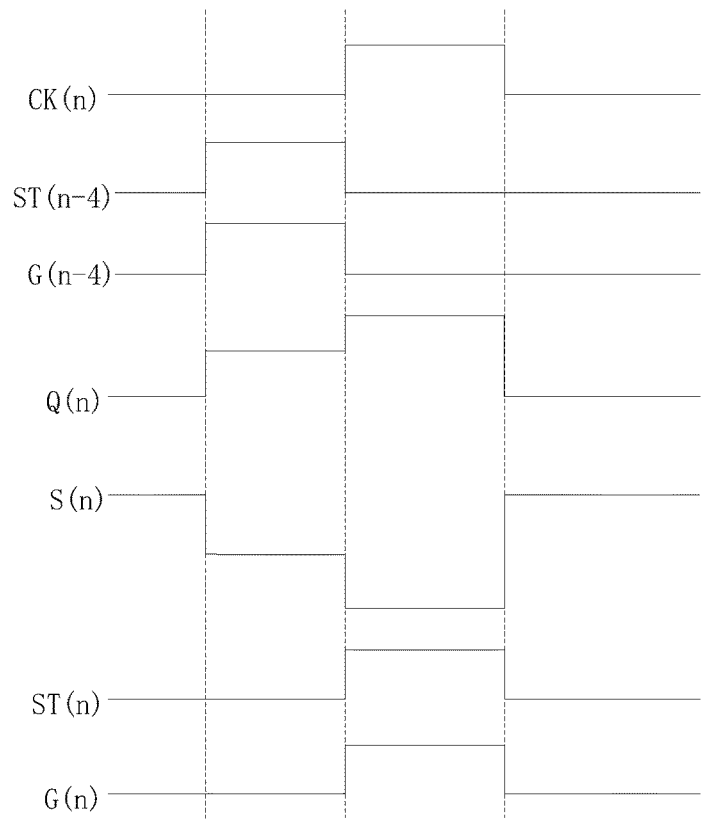
FIG. 4 illustrates a time sequence diagram of an embodiment of the present disclosure.

More particularly, please refer to FIG. 4 which illustrates signal time sequences and FIG. 2, when the first node Q(n) and the high frequency clock signal CK(n) are at the high voltage potential, the stage signal ST(n) is also at the high voltage potential. In the first pull-down holding unit 401, when the first node Q(n) is at the high voltage potential, the third TFT T3 and the fifth TFT T5 are turned on, the constant low voltage Vss is output from the first pull-down holding unit 401 for making the outputted first control signal K(n) be at the low voltage potential. In the meantime, a voltage difference Vgs between the gate and the source of the twelfth TFT T12 is extremely low (because Vgs is equal to the voltage of the first control signal K(n) minus the voltage of the stage signal ST(n)), so that the twelfth TFT T12 is properly turned off. As a result, leakage of current at the first node Q(n) is prevented and the voltage potential of the first node Q(n) can be properly held.

Figure 3:
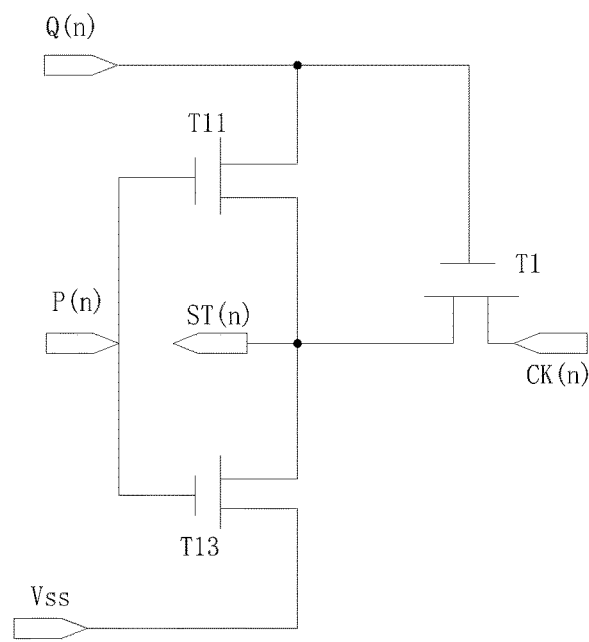
FIG. 3 illustrates a structural diagram of a second STT circuit of an embodiment of the present disclosure.

Furthermore, please refer to FIG. 4 and FIG. 3, when the first node Q(n) and the high frequency clock signal CK(n) are at the high voltage potential, the stage signal ST(n) is also at the high voltage potential. In the second pull-down holding unit 402, when the first node Q(n) is at the high voltage potential, the seventh TFT T7 and the ninth TFT T9 are turned on, the constant low voltage Vss is output from the second pull-down holding unit 402 for making the outputted second control signal P(n) be at the low voltage potential. In the meantime, the voltage difference Vgs between the gate and the source of the thirteenth TFT T13 is extremely low (because Vgs is equal to the voltage potential of the second control signal P(n) minus the voltage potential of the stage signal ST(n)). The thirteenth TFT T13 is properly turned off, so that the leakage of current at the first node Q(n) is prevented and the voltage potential of the first node Q(n) is properly held.

Figure 5:
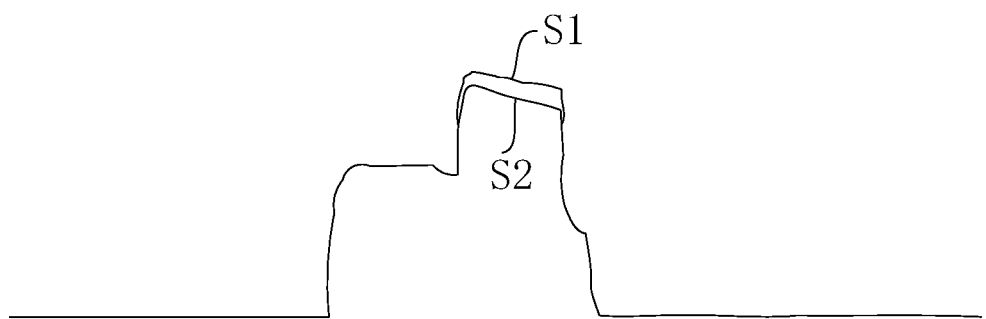
FIG. 5 illustrates a waveform diagram of a node Q of the GOA circuit of an embodiment of the present disclosure.

More particularly, FIG. 5 is a simulation waveform diagram at the node Q output of the GOA circuit of the present disclosure. It is obvious that the performance of a waveform S1 at the node Q of the GOA circuit of the present disclosure is better than the performance of a waveform S2 at the node Q of the existing GOA circuit.

One of the embodiments further provides a liquid crystal display panel comprising a gate driver on array (GOA) circuit. The GOA circuit includes a plurality of cascaded GOA units. Each stage of the GOA units includes a pull-up control module, a pull-up module, a pull-down module, a pull-down holding module, and a hand-down module. Wherein, n is an integer, and in an nth stage of the GOA unit: the pull-up control module is electrically connected to a first node and is configured to receive a first start signal for pulling up a voltage potential of the first node under a control of the first start signal. The pull-up module is electrically connected to the first node and is configured to receive a high frequency clock signal for outputting a scan signal according to the high frequency clock signal under a control of the first node. The pull-down module is electrically connected to the first node and is configured to receive a second start signal and a constant low voltage for pulling down voltage potentials of the first node and the scan signal to the constant low voltage under a control of the second start signal. The pull-down holding module is electrically connected to the first node and the constant low voltage and is configured to receive a first low frequency clock signal and a second low frequency clock signal for holding the voltage potentials of the first node at the constant low voltage and alternately outputting a first control signal and a second control signal under alternating actions of the first low frequency clock signal and the second low frequency clock signal. The hand-down module is electrically connected to the first node and is configured to receive the high frequency clock signal for outputting a stage signal according to the high frequency clock signal under the control of the first node. The pull-down holding module further includes a blocking unit, and the blocking unit is electrically connected to the constant low voltage and the stage signal and is configured to receive the first control signal and the second control signal for blocking a leaking current of the first node.

More particularly, the hand-down module includes a first thin film transistor (TFT), a gate of the first TFT is connected to the first node, a source of the first TFT is connected to the high frequency clock signal, and a drain of the first TFT is configured to output the stage signal.

More particularly, the pull-down holding module comprises a first pull-down holding unit and a second pull-down holding unit. The first pull-down holding unit is electrically connected to the first node, a second node, and the constant low voltage, and is configured to receive the first low frequency clock signal for pulling down voltage potentials of the second node and the first control signal to the constant low voltage when the voltage potential of the first node is pulled up, and holding the voltage potential of the first node at the constant low voltage by periodically raising the voltage potential of the second node according to the first low frequency clock signal after the voltage potential of the first node is pulled down; and wherein the first pull-down holding unit simultaneously outputs the first control signal. The second pull-down holding unit is electrically connected to the first node, a third node, and the constant low voltage, and is configured to receive the second low frequency clock signal for pulling down voltage potentials of the third node and the second control signal to the constant low voltage when the voltage potential of the first node is pulled up, and holding the voltage potential of the first node at the constant low voltage by periodically raising the voltage potential of the third node according to the second low frequency clock signal after the voltage potential of the first node is pulled down; and wherein the second pull-down holding unit simultaneously outputs the second control signal.

Furthermore, the first pull-down holding unit comprises a second TFT, a third TFT, a fourth TFT, and a fifth TFT. A gate of the second TFT and a source of the second TFT are both connected to the first low frequency clock signal. A drain of the second TFT is connected to the second node. A gate of the third TFT is connected to the first node, a source of the third TFT is connected to the second node, and a drain of the third TFT is connected to the constant low voltage. A gate of the fourth TFT is connected to the second node, a source of the fourth TFT is connected to the first low frequency clock signal, and a drain of the fourth TFT is connected to the first control signal. A gate of the fifth TFT is connected to the first node, a source of the fifth TFT is connected to the constant low voltage, and a drain of the fifth TFT is configured to output the first control signal.

Furthermore, the second pull-down holding unit comprises a sixth TFT, a seventh TFT, an eighth TFT, and a ninth TFT. A gate of the sixth TFT and a source of the sixth TFT are both connected to the second low frequency clock signal, and a drain of the sixth TFT is connected to the third node. A gate of the seventh TFT is connected to the first node, a source of the seventh TFT is connected to the third node, and a drain of the seventh TFT is connected to the constant low voltage. A gate of the eighth TFT is connected to the third node, a source of the eighth TFT is connected to the second low frequency clock signal, and a drain of the eighth TFT is configured to output the second control signal. A gate of the ninth TFT is connected to the first node, a source of the ninth TFT is connected to the constant low voltage, and a drain of the ninth TFT is configured to output the second control signal.

Furthermore, the pull-down holding module further comprises a tenth TFT and an eleventh TFT. A gate of the tenth TFT is connected to the first control signal, a source of the tenth TFT is connected to the first node, and a drain of the tenth TFT is configured to receive the stage signal. A gate of the eleventh TFT is connected to the second control signal, a source of the eleventh TFT is connected to the first node, and a drain of the eleventh TFT is configured to receive the stage signal.

More particularly, the blocking unit comprises a twelfth TFT and a thirteenth TFT. A gate of the twelfth TFT is connected to the first control signal, a source of the twelfth TFT is connected to the stage signal, and a drain of the twelfth TFT is connected to the constant low voltage. A gate of the thirteenth TFT is connected to the second control signal, a source of the thirteenth TFT is connected to the stage signal, and a drain of the thirteenth TFT is connected to the constant low voltage.

More particularly, each stage of the GOA units further comprises a bootstrap module electrically connected to the first node and the scan signal and configured to raise and hold the raised voltage potential of the first node when the scan signal outputs a high voltage potential.

Furthermore, the bootstrap module comprises a capacitor, a first electrode plate of the capacitor is electrically connected to the first node and a second electrode plate of the capacitor is electrically connected to the scan signal.

More particularly, the pull-up control module further comprises a third start signal, in first to fourth stages of the GOA units, the first start signals and the third start signals are equal to a starting signal, in the nth stage of the GOA units except the first to the fourth stages of the GOA units, the first start signal is equal to a scan signal of an n−4th stage of the GOA units and the third start signal is equal to a stage signal of the n−4th stage of the GOA units, in a last stage to a fourth-to-last stage of the GOA units, the second start signals are equal to the starting signal, and in the nth stage of the GOA units except the last stage to the fourth-to-last stage of the GOA units, the second start signal is equal to a scan signal of an n+4th stage of the GOA unit.

From the embodiments above:

In the GOA circuit and the liquid crystal display panel provided by the present disclosure, the blocking unit is disposed in each stages of the GOA units for blocking the leaking currents of the first node. The blocking unit includes the twelfth TFT and the thirteenth TFT. When the first node is at the high voltage potential and the stage signal is also at the high voltage potential, the first control signal and the second control signal are at the low voltage potential, and both gates of the twelfth TFT and the thirteenth TFT are at the low voltage potential, so that the gate-source voltage differences between the twelfth TFT and the thirteenth TFT are large enough to properly turn off the twelfth TFT and the thirteenth TFT. Thus, leakage of current at the first node is prevented, allowing the GOA circuit to have higher temperature tolerance so that its reliability is enhanced.

To conclude, although the present disclosure has been disclosed by above-mentioned preferred embodiments, the above-mentioned preferred embodiments are not limitations to the present disclosure. Variations and modifications can be obtained by a person skilled in the art without departing from the aspect and scope of the present disclosure. Therefore, the protected scope of the present disclosure is subject to the defined scope of claims.

What is claimed is:

1. A gate driver on array, GOA, circuit, comprising a plurality of cascaded GOA units (1000), wherein each stage of the GOA units (1000) comprises a pull-up control module (100), a pull-up module (200), a pull-down module (300), a pull-down holding module (400), and a hand-down module (500), wherein n is an integer, and wherein in an nth stage of the GOA unit (1000), the pull-up control module (100) is electrically connected to a first node (Q(n)) and is configured to receive a first start signal (CT1) for pulling up a voltage potential of the first node (Q(n)) under a control of the first start signal (CT1);

the pull-up module (200) is electrically connected to the first node (Q(n)) and is configured to receive a high frequency clock signal (CK(n)) for outputting a scan signal (G(n)) according to the high frequency clock signal (CK(n)) under a control of the first node (Q(n));

the pull-down module (300) is electrically connected to the first node (Q(n)), and is configured to receive a second start signal (CT2) and a constant low voltage (Vss) for pulling down voltage potentials of the first node (Q(n)) and the scan signal (G(n)) to the constant low voltage (Vss) under a control of the second start signal (CT2);

the pull-down holding module (400) is electrically connected to the first node (Q(n)) and the constant low voltage (Vss), and is configured to receive a first low frequency clock signal (LC1) and a second low frequency clock signal (LC2) for holding the voltage potentials of the first node (Q(n)) at the constant low voltage (Vss) and alternately outputting a first control signal (K(n)) and a second control signal (P(n)) under alternating actions of the first low frequency clock signal (LC1) and the second low frequency clock signal (LC2); and the hand-down module (500) is electrically connected to the first node (Q(n)), and is configured to receive the high frequency clock signal (CK(n)) for outputting a stage signal (ST(n)) according to the high frequency clock signal (CK(n)) under the control of the first node (Q(n));

wherein the pull-down holding module (400) further comprises a blocking unit (600), and the blocking unit (600) is electrically connected to the constant low voltage (Vss) and the stage signal (ST(n)), and is configured to receive the first control signal (K(n)) and the second control signal (P(n)) for blocking a leaking current of the first node (Q(n)).

2. The GOA circuit according to claim 1, wherein the hand-down module (500) comprises a first thin film transistor, TFT, (T1), a gate of the first TFT (T1) is connected to the first node (Q(n)), a source of the first TFT (T1) is connected to the high frequency clock signal (CK(n)), and a drain of the first TFT (T1) is configured to output the stage signal (ST(n)).

3. The GOA circuit according to claim 1, wherein the pull-down holding module (400) comprises a first pull-down holding unit (401) and a second pull-down holding unit (402);
wherein the first pull-down holding unit (401) is electrically connected to the first node (Q(n)), a second node (S(n)), and the constant low voltage (Vss), and is configured to receive the first low frequency clock signal (LC1) for pulling down voltage potentials of the second node (S(n)) and the first control signal (K(n)) to the constant low voltage (Vss) when the voltage potential of the first node (Q(n)) is pulled up, and holding the voltage potential of the first node (Q(n)) at the constant low voltage (Vss) by periodically raising the voltage potential of the second node (S(n)) according to the first low frequency clock signal (LC1) after the voltage potential of the first node (Q(n)) is pulled down, wherein the first pull-down holding unit (401) simultaneously outputs the first control signal (K(n)); and
wherein the second pull-down holding unit (402) is electrically connected to the first node (Q(n)), a third node (T(n)), and the constant low voltage (Vss), and is configured to receive the second low frequency clock signal (LC2) for pulling down voltage potentials of the third node (T(n)) and the second control signal (P(n)) to the constant low voltage (Vss) when the voltage potential of the first node (Q(n)) is pulled up, and holding the voltage potential of the first node (Q(n)) at the constant low voltage (Vss) by periodically raising the voltage potential of the third node (T(n)) according to the second low frequency clock signal (LC2) after the voltage potential of the first node (Q(n)) is pulled down, wherein the second pull-down holding unit (402) simultaneously outputs the second control signal (P(n)).

4. The GOA circuit according to claim 3, wherein the first pull-down holding unit (401) comprises a second TFT (T2), a third TFT (T3), a fourth TFT (T4), and a fifth TFT (T5);
a gate of the second TFT (T2) and a source of the second TFT (T2) are both connected to the first low frequency clock signal (LC1), and a drain of the second TFT (T2) is connected to the second node (S(n));
a gate of the third TFT (T3) is connected to the first node (Q(n)), a source of the third TFT (T3) is connected to the second node (S(n)), and a drain of the third TFT (T3) is connected to the constant low voltage (Vss);
a gate of the fourth TFT (T4) is connected to the second node (S(n)), a source of the fourth TFT (T4) is connected to the first low frequency clock signal (LC1), and a drain of the fourth TFT (T4) is configured to output the first control signal (K(n)); and
a gate of the fifth TFT (T5) is connected to the first node (Q(n)), a source of the fifth TFT (T5) is connected to the constant low voltage (Vss), and a drain of the fifth TFT (T5) is configured to output the first control signal (K(n)).

5. The GOA circuit according to claim 3, wherein the second pull-down holding unit (402) comprises a sixth TFT (T6), a seventh TFT (T7), an eighth TFT (T8), and a ninth TFT (T9);
a gate of the sixth TFT (T6) and a source of the sixth TFT (T6) are both connected to the second low frequency clock signal (LC2), and a drain of the sixth TFT (T6) is connected to the third node (T(n));
a gate of the seventh TFT (T7) is connected to the first node (Q(n)), a source of the seventh TFT (T7) is connected to the third node (T(n)), and a drain of the seventh TFT (T7) is connected to the constant low voltage (Vss);
a gate of the eighth TFT (T8) is connected to the third node (T(n)), a source of the eighth TFT (T8) is connected to the second low frequency clock signal (LC2), and a drain of the eighth TFT (T8) is configured to output the second control signal (P(n)); and
a gate of the ninth TFT (T9) is connected to the first node (Q(n)), a source of the ninth TFT (T9) is connected to the constant low voltage (Vss), and a drain of the ninth TFT (T9) is configured to output the second control signal (P(n)).

6. The GOA circuit according to claim 1, wherein the pull-down holding module (400) further comprises a tenth TFT (T10) and an eleventh TFT (T11);
wherein a gate of the tenth TFT (T10) is connected to the first control signal (K(n)), a source of the tenth TFT (T10) is connected to the first node (Q(n)), and a drain of the tenth TFT (T10) is configured to receive the stage signal (ST(n)); and
wherein a gate of the eleventh TFT (T11) is connected to the second control signal (P(n)), a source of the eleventh TFT (T11) is connected to the first node (Q(n)), and a drain of the eleventh TFT (T11) is configured to receive the stage signal (ST(n)).

7. The GOA circuit according to claim 1, wherein the blocking unit (600) comprises a twelfth TFT (T12) and a thirteenth TFT (T13);
a gate of the twelfth TFT (T12) is connected to the first control signal (K(n)), a source of the twelfth TFT (T12) is connected to the stage signal (ST(n)), and a drain of the twelfth TFT (T12) is connected to the constant low voltage (Vss); and
a gate of the thirteenth TFT (T13) is connected to the second control signal (P(n)), a source of the thirteenth TFT (T13) is connected to the stage signal (ST(n)), and a drain of the thirteenth TFT (T13) is connected to the constant low voltage (Vss).

8. The GOA circuit according to claim 1, wherein each stage of the GOA units (1000) further comprises a bootstrap module (700) electrically connected to the first node (Q(n)) and the scan signal (G(n)) and configured to raise and hold the raised voltage potential of the first node (Q(n)) when the scan signal (G(n)) outputs a high voltage potential.

9. The GOA circuit according to claim 8, wherein the bootstrap module (700) comprises a capacitor, a first electrode plate of the capacitor is electrically connected to the first node (Q(n)), and a second electrode plate of the capacitor is electrically connected to the scan signal (G(n)).

10. The GOA circuit according to claim 1, wherein the pull-up control module (100) further comprises a third start signal (CT3), in first to fourth stages of the GOA units, the first start signal (CT1) and the third start signal (CT3) are equal to a starting signal (STV), in the nth stage of the GOA units except the first to the fourth stages of the GOA units, the first start signal (CT1) is equal to a scan signal (G(n−4))

of an (n−4)th stage of the GOA units and the third start signal (CT3) is equal to a stage signal (ST(n−4)) of the (n−4)th stage of the GOA units, in a last stage to a fourth-to-last stage of the GOA units, the second start signal (CT2) is equal to the starting signal (STV), and in the nth stage of the GOA units except the last stage to the fourth-to-last stage of the GOA units, the second start signal (CT2) is equal to a scan signal (G(n+4)) of an (n+4)th stage of the GOA units.

11. A liquid crystal display panel, comprising a gate driver on array, GOA, circuit, wherein the GOA circuit comprises a plurality of cascaded GOA units (1000), and each stage of the GOA units (1000) comprises a pull-up control module (100), a pull-up module (200), a pull-down module (300), a pull-down holding module (400), and a hand-down module (500), wherein n is an integer, and wherein in an nth stage of the GOA unit (1000):
- the pull-up control module (100) is electrically connected to a first node (Q(n)) and is configured to receive a first start signal (CT1) for pulling up a voltage potential of the first node (Q(n)) under a control of the first start signal (CT1);
- the pull-up module (200) is electrically connected to the first node (Q(n)) and is configured to receive a high frequency clock signal (CK(n)) for outputting a scan signal (G(n)) according to the high frequency clock signal (CK(n)) under a control of the first node (Q(n));
- the pull-down module (300) is electrically connected to the first node (Q(n)), and is configured to receive a second start signal (CT2) and a constant low voltage (Vss) for pulling down voltage potentials of the first node (Q(n)) and the scan signal (G(n)) to the constant low voltage (Vss) under a control of the second start signal (CT2);
- the pull-down holding module (400) is electrically connected to the first node (Q(n)) and the constant low voltage (Vss), and is configured to receive a first low frequency clock signal (LC1) and a second low frequency clock signal (LC2) for holding the voltage potentials of the first node (Q(n)) at the constant low voltage (Vss) and alternately outputting a first control signal (K(n)) and a second control signal (P(n)) under alternating actions of the first low frequency clock signal (LC1) and the second low frequency clock signal (LC2); and
- the hand-down module (500) is electrically connected to the first node (Q(n)), and is configured to receive the high frequency clock signal (CK(n)) for outputting a stage signal (ST(n)) according to the high frequency clock signal (CK(n)) under the control of the first node (Q(n));
- wherein the pull-down holding module (400) further comprises a blocking unit (600), and the blocking unit (600) is electrically connected to the constant low voltage (Vss) and the stage signal (ST(n)), and is configured to receive the first control signal (K(n)) and the second control signal (P(n)) for blocking a leaking current of the first node (Q(n)).

12. The liquid crystal display panel according to claim 11, wherein the hand-down module (500) comprises a first thin film transistor (TFT), (T1), a gate of the first TFT (T1) is connected to the first node (Q(n)), a source of the first TFT (T1) is connected to the high frequency clock signal (CK(n)), and a drain of the first TFT (T1) is configured to output the stage signal (ST(n)).

13. The liquid crystal display panel according to claim 11, wherein the pull-down holding module (400) comprises a first pull-down holding unit (401) and a second pull-down holding unit (402);
- wherein the first pull-down holding unit (401) is electrically connected to the first node (Q(n)), a second node (S(n)), and the constant low voltage (Vss), and is configured to receive the first low frequency clock signal (LC1) for pulling down voltage potentials of the second node (S(n)) and the first control signal (K(n)) to the constant low voltage (Vss) when the voltage potential of the first node (Q(n)) is pulled up, and holding the voltage potential of the first node (Q(n)) at the constant low voltage (Vss) by periodically raising the voltage potential of the second node (S(n)) according to the first low frequency clock signal (LC1) after the voltage potential of the first node (Q(n)) is pulled down, wherein the first pull-down holding unit (401) simultaneously outputs the first control signal (K(n)); and
- wherein the second pull-down holding unit (402) is electrically connected to the first node (Q(n)), a third node (T(n)), and the constant low voltage (Vss), and is configured to receive the second low frequency clock signal (LC2) for pulling down voltage potentials of the third node (T(n)) and the second control signal (P(n)) to the constant low voltage (Vss) when the voltage potential of the first node (Q(n)) is pulled up, and holding the voltage potential of the first node (Q(n)) at the constant low voltage (Vss) by periodically raising the voltage potential of the third node (T(n)) according to the second low frequency clock signal (LC2) after the voltage potential of the first node (Q(n)) is pulled down, wherein the second pull-down holding unit (402) simultaneously outputs the second control signal (P(n)).

14. The liquid crystal display panel according to claim 13, wherein the first pull-down holding unit (401) comprises a second TFT (T2), a third TFT (T3), a fourth TFT (T4), and a fifth TFT (T5);
- wherein a gate of the second TFT (T2) and a source of the second TFT (T2) are both connected to the first low frequency clock signal (LC1), and a drain of the second TFT (T2) is connected to the second node (S(n));
- a gate of the third TFT (T3) is connected to the first node (Q(n)), a source of the third TFT (T3) is connected to the second node (S(n)), and a drain of the third TFT (T3) is connected to the constant low voltage (Vss);
- a gate of the fourth TFT (T4) is connected to the second node (S(n)), a source of the fourth TFT (T4) is connected to the first low frequency clock signal (LC1), and a drain of the fourth TFT (T4) is connected to the first control signal (K(n)); and
- a gate of the fifth TFT (T5) is connected to the first node (Q(n)), a source of the fifth TFT (T5) is connected to the constant low voltage (Vss), and a drain of the fifth TFT (T5) is configured to output the first control signal (K(n)).

15. The liquid crystal display panel according to claim 13, wherein the second pull-down holding unit (402) comprises a sixth TFT (T6), a seventh TFT (T7), an eighth TFT (T8), and a ninth TFT (T9);
- wherein a gate of the sixth TFT (T6) and a source of the sixth TFT (T6) are both connected to the second low frequency clock signal (LC2), and a drain of the sixth TFT (T6) is connected to the third node (T(n));
- a gate of the seventh TFT (T7) is connected to the first node (Q(n)), a source of the seventh TFT (T7) is connected to the third node (T(n)), and a drain of the seventh TFT (T7) is connected to the constant low voltage (Vss);

a gate of the eighth TFT (T8) is connected to the third node (T(n)), a source of the eighth TFT (T8) is connected to the second low frequency clock signal (LC2), and a drain of the eighth TFT (T8) is configured to output the second control signal (P(n)); and a gate of the ninth TFT (T9) is connected to the first node (Q(n)), a source of the ninth TFT (T9) is connected to the constant low voltage (Vss), and a drain of the ninth TFT (T9) is configured to output the second control signal (P(n)).

16. The liquid crystal display panel according to claim 11, wherein the pull-down holding module (400) further comprises a tenth TFT (T10) and an eleventh TFT (T11);

wherein a gate of the tenth TFT (T10) is connected to the first control signal (K(n)), a source of the tenth TFT (T10) is connected to the first node (Q(n)), and a drain of the tenth TFT (T10) is configured to receive the stage signal (ST(n)); and a gate of the eleventh TFT (T11) is connected to the second control signal (P(n)), a source of the eleventh TFT (T11) is connected to the first node (Q(n)), and a drain of the eleventh TFT (T11) is configured to receive the stage signal (ST(n)).

17. The liquid crystal display panel according to claim 11, wherein the blocking unit (600) comprises a twelfth TFT (T12) and a thirteenth TFT (T13);

a gate of the twelfth TFT (T12) is connected to the first control signal (K(n)), a source of the twelfth TFT (T12) is connected to the stage signal (ST(n)), and a drain of the twelfth TFT (T12) is connected to the constant low voltage (Vss); and a gate of the thirteenth TFT (T13) is connected to the second control signal (P(n)), a source of the thirteenth TFT (T13) is connected to the stage signal (ST(n)), and a drain of the thirteenth TFT (T13) is connected to the constant low voltage (Vss).

18. The liquid crystal display panel according to claim 11, wherein each stage of the GOA units (1000) further comprises a bootstrap module (700) electrically connected to the first node (Q(n)) and the scan signal (G(n)) and configured to raise and hold the raised voltage potential of the first node (Q(n)) when the scan signal (G(n)) outputs a high voltage potential.

19. The liquid crystal display panel according to claim 18, wherein the bootstrap module (700) comprises a capacitor, a first electrode plate of the capacitor is electrically connected to the first node (Q(n)), and a second electrode plate of the capacitor is electrically connected to the scan signal (G(n)).

20. The liquid crystal display panel according to claim 11, wherein the pull-up control module (100) further comprises a third start signal (CT3), in first to fourth stages of the GOA units, the first start signal (CT1) and the third start signal (CT3) are equal to a starting signal (STV), in the nth stage of the GOA units except the first to the fourth stages of the GOA units, the first start signal (CT1) is equal to a scan signal (G(n−4)) of an (n−4)th stage of the GOA units and the third start signal (CT3) is equal to a stage signal (ST(n−4)) of the (n−4)th stage of the GOA units, in a last stage to a fourth-to-last stage of the GOA units, the second start signal (CT2) is equal to the starting signal (STV), and in the nth stage of the GOA units except the last stage to the fourth-to-last stage of the GOA units, the second start signal (CT2) is equal to a scan signal (G(n+4)) of an (n+4)th stage of the GOA units.

* * * * *